(12) United States Patent
Shimoi et al.

(10) Patent No.: US 8,591,753 B2
(45) Date of Patent: Nov. 26, 2013

(54) LASER PROCESSING METHOD

(75) Inventors: Hideki Shimoi, Hamamatsu (JP); Keisuke Araki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 117 days.

(21) Appl. No.: 13/388,739

(22) PCT Filed: Jul. 19, 2011

(86) PCT No.: PCT/JP2011/066321
§ 371 (c)(1),
(2), (4) Date: Feb. 3, 2012

(87) PCT Pub. No.: WO2012/014710
PCT Pub. Date: Feb. 2, 2012

(65) Prior Publication Data
US 2012/0131958 A1   May 31, 2012

(30) Foreign Application Priority Data

Jul. 26, 2010  (JP) ................................ 2010-167406

(51) Int. Cl.
*C03C 15/00*  (2006.01)
(52) U.S. Cl.
USPC .................. 216/55; 216/56; 216/87; 216/97; 65/31
(58) Field of Classification Search
None
See application file for complete search history.

(56) References Cited

U.S. PATENT DOCUMENTS

| | | | |
|---|---|---|---|
| 6,992,026 B2 | 1/2006 | Fukuyo et al. | |
| 7,033,519 B2 | 4/2006 | Taylor et al. | |
| 2001/0009250 A1* | 7/2001 | Herman et al. | 219/121.69 |
| 2002/0108519 A1* | 8/2002 | Friedman | 101/467 |
| 2005/0187092 A1* | 8/2005 | Bookbinder et al. | 501/54 |
| 2005/0272223 A1 | 12/2005 | Fujii et al. | |
| 2007/0066044 A1* | 3/2007 | Abe et al. | 438/612 |
| 2010/0136766 A1 | 6/2010 | Sakamoto et al. | |
| 2010/0213594 A1* | 8/2010 | Higashino et al. | 257/686 |
| 2010/0243625 A1* | 9/2010 | Osako | 219/121.72 |
| 2012/0181250 A1* | 7/2012 | Jalbert | 216/34 |

FOREIGN PATENT DOCUMENTS

| | | |
|---|---|---|
| JP | 4-150212 | 5/1992 |
| JP | 5-74335 | 3/1993 |
| JP | 7-40482 | 5/1995 |
| JP | 10-202878 | 8/1998 |

(Continued)

OTHER PUBLICATIONS

M. Watanabe, et al., "Femtosecond laser-assisted three-dimensional microfabrication in silica", Mar. 1, 2001, Optics Letters, vol. 26, No. 5, p. 277-279.

*Primary Examiner* — Allan Olsen
(74) *Attorney, Agent, or Firm* — Drinker Biddle & Reath LLP

(57) ABSTRACT

A laser processing method of converging a laser light into an object to be processed made of glass so as to form a modified region and etching the object along the modified region so as to form a through hole in the object comprises a browning step of discoloring at least a part of the object by browning; a laser light converging step of forming the modified region in the discolored part of the object by converging the laser light into the object after the browning step; and an etching step of etching the object after the laser light converging step so as to advance the etching selectively along the modified region and form the through hole.

5 Claims, 14 Drawing Sheets

(56) References Cited

FOREIGN PATENT DOCUMENTS

| | | |
|---|---|---|
| JP | 2873937 | 1/1999 |
| JP | 2002-210730 | 7/2002 |
| JP | 2004-128445 | 4/2004 |
| JP | 2004-136358 | 5/2004 |
| JP | 2004-160618 | 6/2004 |
| JP | 2004-223586 | 8/2004 |
| JP | 2004-304130 | 10/2004 |
| JP | 2004-351494 | 12/2004 |
| JP | 2004-359475 | 12/2004 |
| JP | 2005-1211 | 1/2005 |
| JP | 2005-74663 | 3/2005 |
| JP | 2005-121915 | 5/2005 |
| JP | 2005-121916 | 5/2005 |
| JP | 2005-144586 | 6/2005 |
| JP | 2005-144622 | 6/2005 |
| JP | 2005-152693 | 6/2005 |
| JP | 2005-169993 | 6/2005 |
| JP | 2005-206401 | 8/2005 |
| JP | 2005-208175 | 8/2005 |
| JP | 2005-306702 | 11/2005 |
| JP | 2005-351774 | 12/2005 |
| JP | 2006-176355 | 7/2006 |
| JP | 2006-290630 | 10/2006 |
| JP | 2007-36758 | 2/2007 |
| JP | 2007-101833 | 4/2007 |
| JP | 2009-143787 | 7/2009 |
| JP | 2010-155259 | 7/2010 |
| WO | 00/50198 | 8/2000 |

* cited by examiner (a)

(b)

(c)

(a)

(b)

LASER PROCESSING METHOD

TECHNICAL FIELD

The present invention relates to a laser processing method and, in particular, to a laser processing method for forming a through hole in an object to be processed.

BACKGROUND ART

Known as a conventional laser processing method is one comprising converging a laser light into an object to be processed made of glass so as to form a modified region and etching the object so as to remove the modified region, thereby forming a through hole in the object (see, for example, Patent Literature 1).

CITATION LIST

Patent Literature

Patent Literature 1: Japanese Patent Application Laid-Open No. 2005-206401

SUMMARY OF INVENTION

Technical Problem

In laser processing methods such as the one mentioned above, the transmittance of glass for the laser light is so high that the laser light is required to have a very short pulse or a short wavelength, for example, in order to converge the laser light at the object made of glass and form the modified region, whereby the modified region may be hard to form. Hence, it has been desired for the laser processing methods such as the one mentioned above to enhance the proccessability for the laser light in the object made of glass.

It is therefore an object of the present invention to provide a laser processing method which can enhance the proccessability for a laser light in an object to be processed made of glass.

Solution to Problem

One aspect of the present invention relates to a laser processing method. This laser processing method is a laser processing method of converging a laser light into an object to be processed made of glass so as to form a modified region and etching the object along the modified region so as to form a through hole in the object, the method comprising a browning step of discoloring at least a part of the object by browning; a laser light converging step of forming the modified region in a discolored part of the object by converging the laser light into the object after the browning step; and an etching step of etching the object after the laser light converging step so as to advance the etching selectively along the modified region and form the through hole.

This laser processing method can lower the transmittance for the laser light in the discolored part of the object discolored by browning, so as to induce absorption of the laser light. This makes it easier to form the modified region by convergence of the laser light in the discolored part of the object. Hence, the proccessability for the laser light can be enhanced in the object made of glass.

The method may further comprise a color recovery step of recovering a color in at least a part of the discolored part in the object by heat-treating the object after the laser light converging step. This enables the discolored part in the object to regain its color before discoloring.

The browning step may discolor a plurality of parts in the object, while the laser light converging step may irradiate the object with the laser light while relatively moving the laser light in one direction so as to traverse the plurality of discolored parts. In this case, when irradiated with the relatively moving laser light, each of the discolored parts is likely to absorb the laser light because of their low transmittance, whereby the modified region is formed easily. On the other hand, the parts not discolored exhibit high transmittance and thus are hard to form modified regions. Therefore, a plurality of modified regions can easily be formed in the object without performing laser light irradiation in an on/off mode, whereby laser light irradiation condition control which is highly accurate and critical becomes unnecessary for forming a plurality of modified regions in the object.

The discolored part may have a shade corresponding to a size of the modified region to be formed in the laser light converging step. In this case, since the discolored part has a transmittance for the laser light corresponding to the shade, the size of the modified region formed by convergence of the laser light can be controlled by the shade of the discolored part of the object.

The discolored part may have a gradation. In this case, for the laser light, the discolored part exhibits a transmittance changing stepwise according to the gradation. Therefore, a plurality of modified regions having different sizes can be formed collectively according to the gradation.

Advantageous Effects of Invention

The laser processing method of the present invention can enhance the proccessability for a laser light in an object to be processed made of glass.

DESCRIPTION OF EMBODIMENTS

In the following, preferred embodiments of the present invention will be explained in detail with reference to the drawings. In the following explanations, the same or equivalent constituents will be referred to with the same signs while omitting their overlapping descriptions.

The laser processing method in accordance with an embodiment converges a laser light into an object to be processed, so as to form a modified region. Therefore, the forming of the modified region will firstly be explained in the following with reference to FIGS. 1 to 6.

Figure 1:
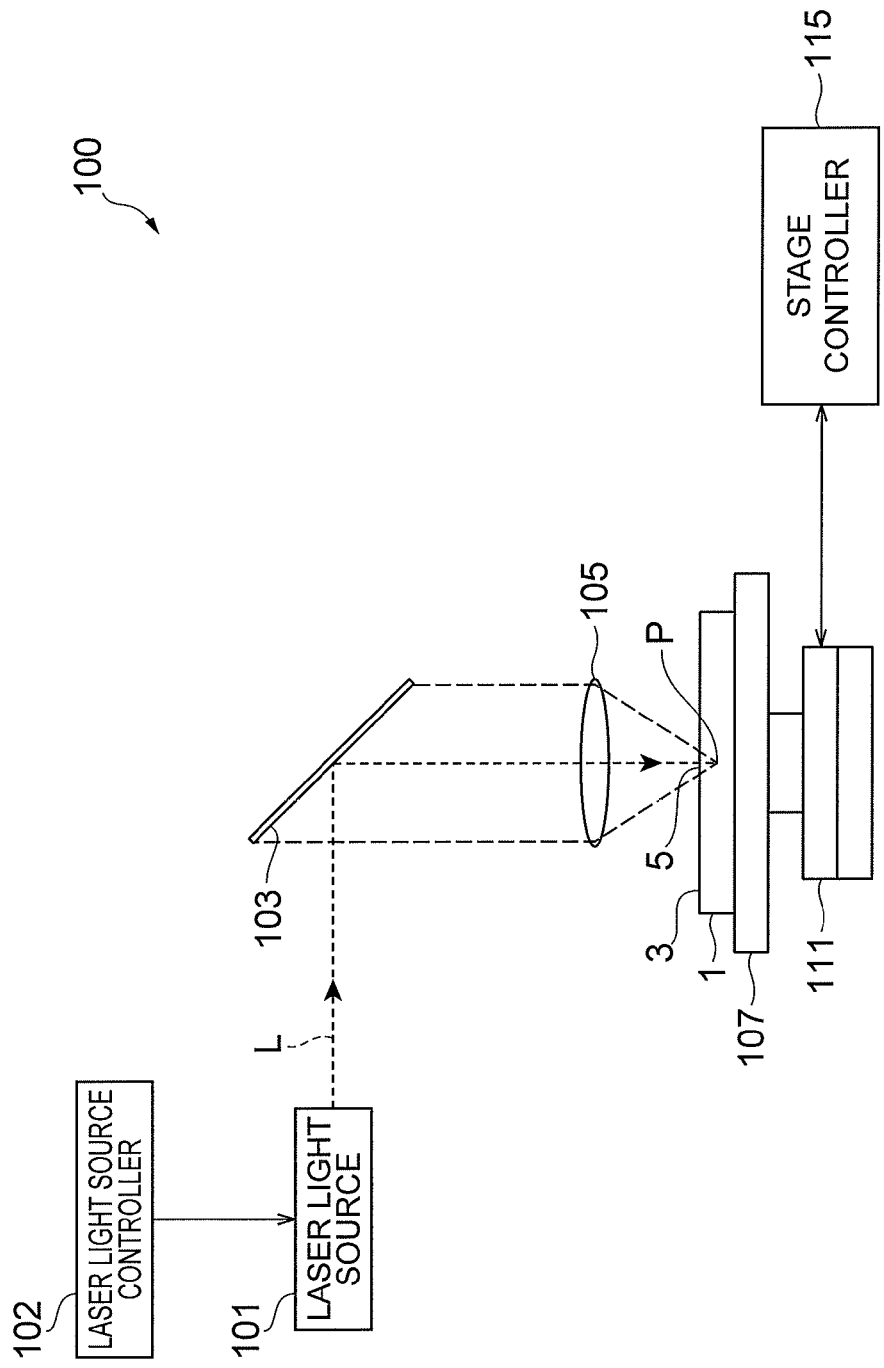
[FIG. 1] is a schematic structural diagram of a laser processing device used for forming a modified region.

As illustrated in FIG. 1, a laser processing device 100 comprises a laser light source 101 which causes a laser light L to oscillate in a pulsating manner, a dichroic mirror 103 arranged such as to change the direction of the optical axis (optical path) of the laser light L by 90°, and a condenser lens 105 for converging the laser light L. The laser processing device 100 also comprises a support table 107 for supporting an object to be processed 1 irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the movement of the stage 111.

In the laser processing device 100, the laser light L emitted from the laser light source 101 changes the direction of its optical axis by 90° with the dichroic mirror 103 and then is converged by the condenser lens 105 into the sheet-like object to be processed 1 mounted on the support table 107. At the same time, the stage 111 is shifted, so that the object 1 moves relative to the laser light L along a part to form a modified region 5. This forms a modified region in the object 1 along the part 5.

Figure 2:
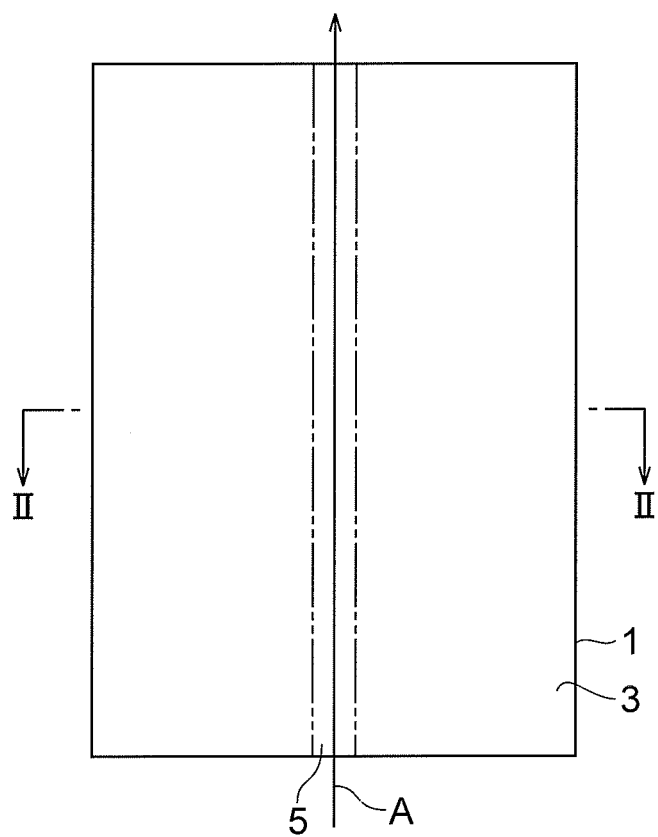
[FIG. 2] is a plan view of an object to be processed in which the modified region is to be formed.
Figure 3:
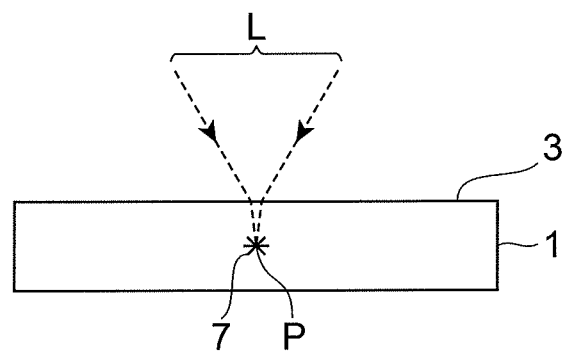
[FIG. 3] is a sectional view of the object taken along the line III-III of FIG. 2.
Figure 4:
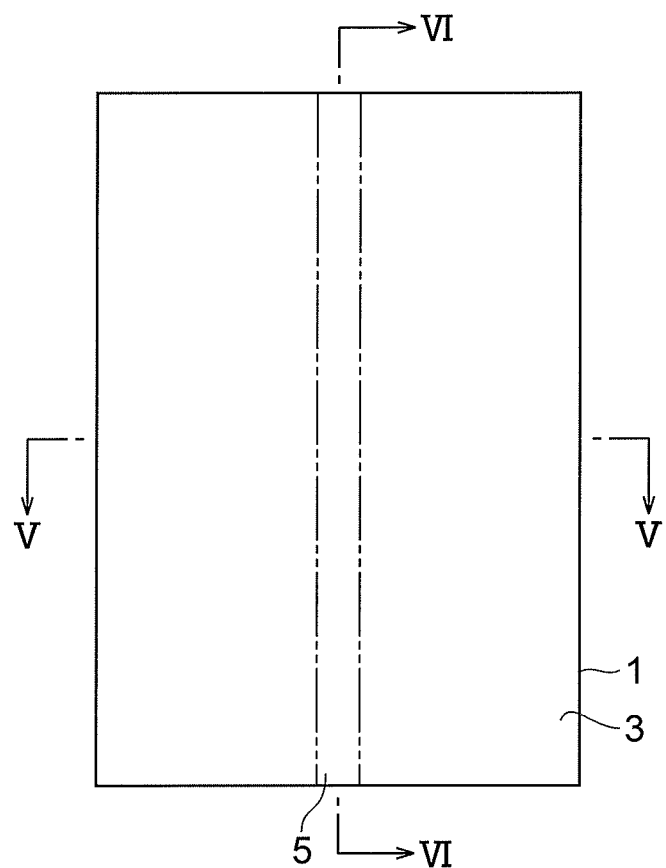
[FIG. 4] is a plan view of the object after laser processing.
Figure 5:
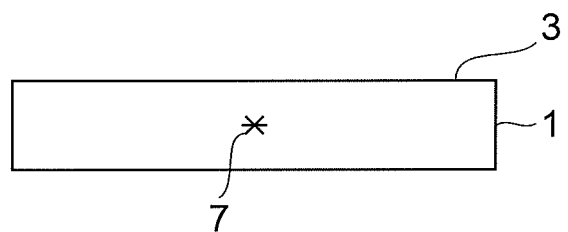
[FIG. 5] is a sectional view of the object taken along the line V-V of FIG. 4.
Figure 6:
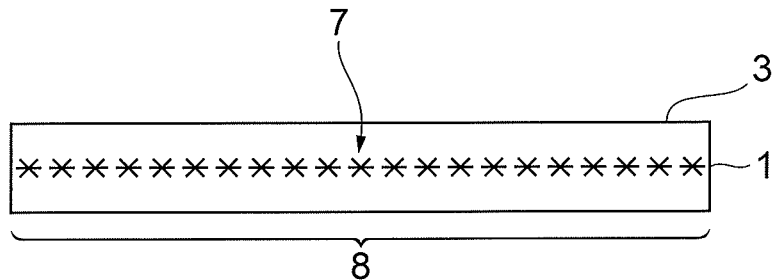
[FIG. 6] is a sectional view of the object taken along the line VI-VI of FIG. 4.

As illustrated in FIG. 2, the part 5 is set in the object 1, for which a semiconductor material, a piezoelectric material, or the like is used. Here, the part 5 is a virtual line extending straight. When forming a modified region within the object 1, the laser light L is relatively moved along the part 5 (i.e., in the direction of arrow A in FIG. 2) while locating a converging point P within the object 1 as illustrated in FIG. 3. This forms a modified region 7 within the object 1 along the part 5 as illustrated in FIGS. 4 to 6, whereby the modified region 7 becomes a removing region 8 to be removed by etching which will be explained later.

The converging point P is a position at which the laser light L is converged. The part 5 may be curved instead of being straight, shaped into a three-dimensional form combining them, or specified in terms of coordinates. The modified region 7 may be formed either continuously or intermittently. The modified region 7 may be formed like lines or dots. It will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point P within the object 1 while being transmitted therethrough, whereby the modified region 7 is formed in the object 1 (i.e., internal absorption type laser processing). In the case of forming a removing part such as a hole or groove by melting it away from the front face 3, the processing region gradually progresses from the front face 3 side to the rear face side (i.e., surface absorption type laser processing) in general.

The modified region 7 in accordance with this embodiment means regions whose physical characteristics such as density, refractive index, and mechanical strength have attained states different from those of their surroundings. Examples of the modified region 7 include molten processed regions, crack regions, dielectric breakdown regions, refractive index changed regions, and their mixed regions. Further examples of the modified region 7 include an area whose density region has changed from that of an unmodified region in a material of the object 1 and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region or in only a part or a plurality of parts thereof. Examples of the object 1 include those containing or constituted by glass (as will be explained later in detail).

Here, this embodiment forms the modified region 7 in the object 1 and then etches the object 1, so as to advance the etching selectively along fractures (also known as cracks, microcracks, cuts, and the like; hereinafter simply referred to as "fractures") included in or extending from the modified region 7, thereby removing a part extending along the modified region 7 in the object 1.

In the etching in this embodiment, for example, a capillary action or the like is utilized so that fractures included in or extending from the modified region 7 are impregnated with an etchant, so as to advance the etching along fracture surfaces. This advances the etching selectively at a higher etching rate along the fractures in the object 1 and removes them. At the same time, by utilizing the characteristic feature that the etching rate of the modified region 7 itself is high, the etching is selectively advanced along the modified region 7, so as to remove the latter.

Examples of the etching of this embodiment include a case where the object is immersed in the etchant (dipping) and a case where the object is coated with the etchant while being rotated (spin etching). Here, the etching is isotropic etching The etchant is used at a temperature ranging from ambient temperature to about 100° C., which is set appropriately according to a required etching rate or the like. Employed as the etchant is a fluorine-based etchant, examples of which include alkali solutions such as KOH (potassium hydroxide) which is an alkali etchant, HF (hydrofluoric acid), a mixed liquid of HF and $H_2O$ (water), and $NH_4F$ (saturated aqueous solution of ammonium bifluoride). Employable as the etchant are not only liquids but also those in the form of a gel (jelly or semisolid).

The isotropic etching is applicable to relatively thin object to be processed (having a thickness of 10 μm to 100 μm, for example), so that the etching can advance isotropically independent of the crystal orientation and the modified region. When a fracture is exposed to a front face in this case, the etchant travels through the fracture to wet the inside, so that the whole surface in the thickness direction becomes a start point for the modified region, whereby a chip etched such that its cut surface is depressed into a semicircular form can be taken out.

First Embodiment

Figure 7:
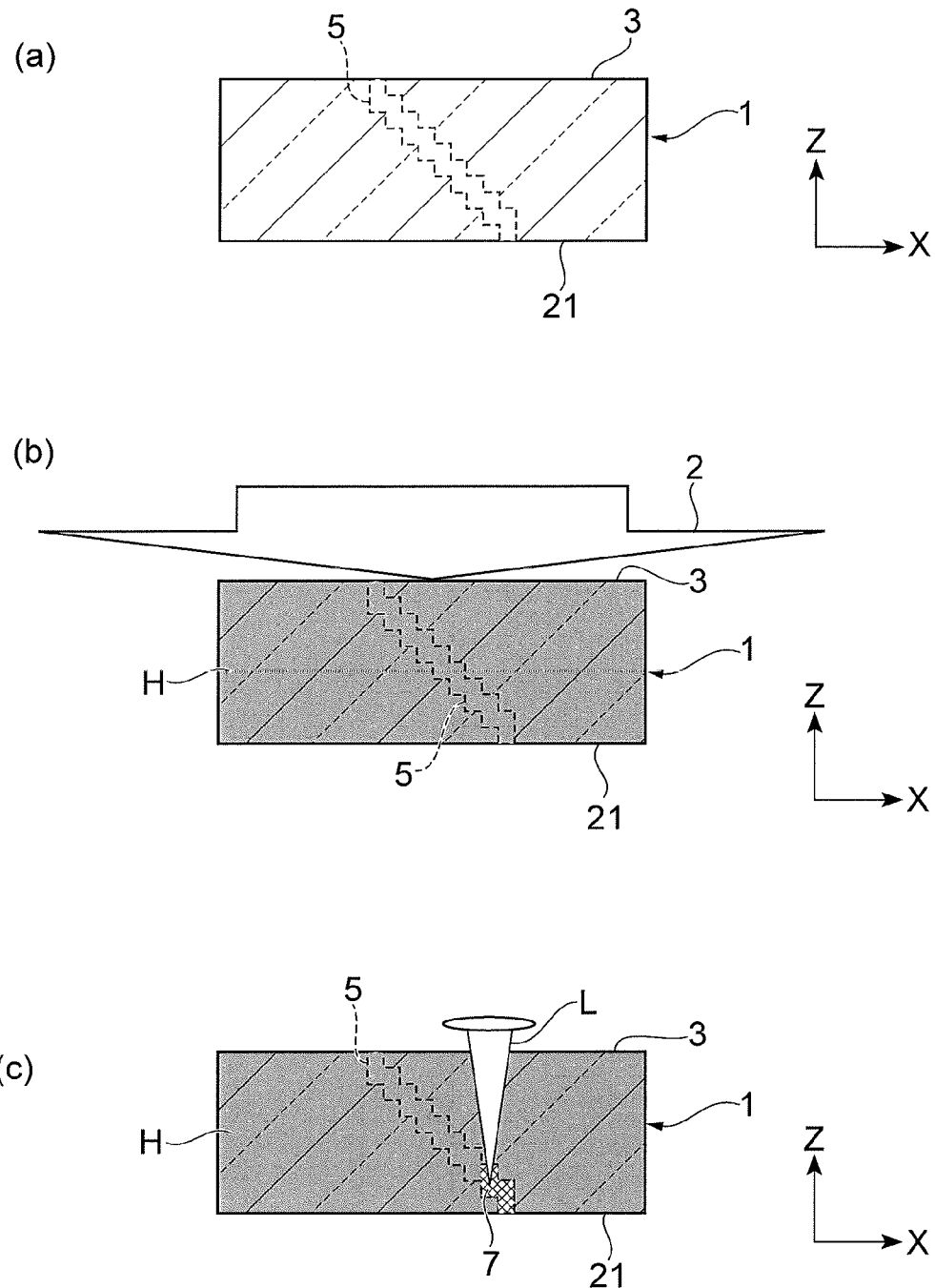
[FIG. 7](a) is a flow diagram illustrating the laser processing method in accordance with a first embodiment of the present invention, (b) is a flow diagram illustrating a sequel to FIGS. 7(a), and (c) is a flow diagram illustrating a sequel to FIG. 7(b)
Figure 8:
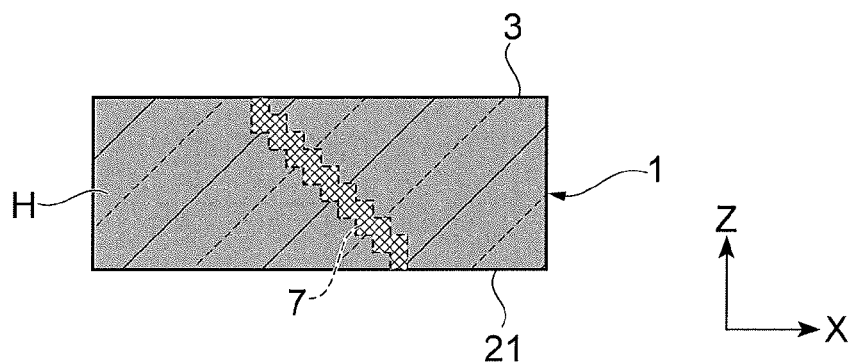
[FIG. 8](a) is a flow diagram illustrating a sequel to FIG. 7(c), (b) is a flow diagram illustrating a sequel to FIGS. 8(a), and (c) is a flow diagram illustrating a sequel to FIG. 8(b)
Figure 8:
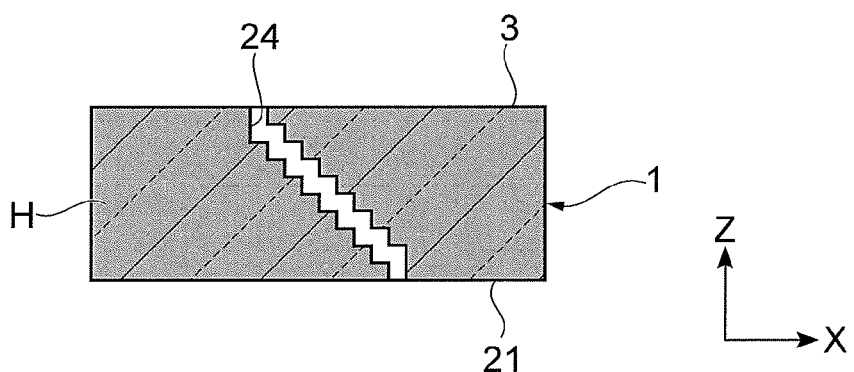
Figure 8:
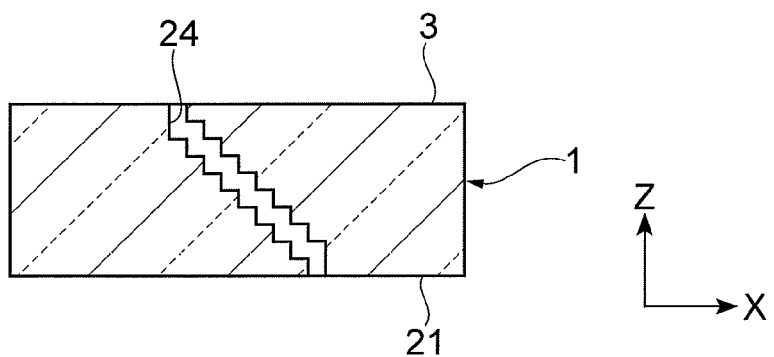

The laser processing method in accordance with the first embodiment of the present invention will now be explained in detail. FIGS. 7 and 8 are flow diagrams illustrating the laser processing method in accordance with the first embodiment of the present invention. The following explanations will assume the thickness direction of the object 1 (the irradiation direction of the laser light L) to be the Z direction and one direction orthogonal to the thickness direction to be the X direction.

As illustrated in FIGS. 7 and 8, this embodiment is a processing method for making a component (interposer or the like) for electrically connecting a semiconductor device and a printed wiring board or flexible substrate to each other, for example, and forms a through hole 24 (see FIG. 11) in the object 1 and inserts a conductor in the through hole 24, so as to produce a through-hole electrode.

As illustrated in FIG. 7(a), the object 1 is a glass substrate which can be discolored by browning and has a transparent color (transparency to visible light). Employed as the object 1 is a glass material other than silica glass (quartz) which has a high purity of $SiO_2$. That is, the object 1 can be discolored by browning and is made of a glass material containing a predetermined amount or more of impurities which are compositions other than $SiO_2$. The object 1 has front and rear faces 3, 21.

In the object 1, a part to form a modified region 5 is programmably set along the part corresponding the through-hole 24 as being specified by three-dimensional coordinates. This part 5 is set such as to extend in a direction tilted with respect to the thickness direction of the object 1.

First, when processing the object 1 by the laser processing method of this embodiment, the object 1 is irradiated with an X-ray 2 from the front face 3 side for a predetermined time as illustrated in FIG. 7(b). This discolors the object 1 from the transparent color to dark yellowish brown by browning. As a result, a discolored part H exhibiting a low transmittance for the laser light L is formed throughout the object 1. The browning means a phenomenon in which glass is denatured upon irradiation with a fast neutron so as to be discolored (tinted).

During the tinting by browning, this embodiment discolors the object 1 such as to provide it with a shade corresponding to the size of a modified region 7 to be formed in a later stage. Specifically, irradiation conditions such as the irradiation intensity of the X-ray and time are set so that the discolored part H is discolored by such a shade that the transmittance for the laser light L becomes a predetermined value. For example, irradiation with the X-ray 2 is performed for a predetermined time under the irradiation conditions of 130 kV and 130 μA, so that the discolored part H exhibits a transmittance of several ten % (e.g., 20%) for the laser light L having a wavelength of 1064 nm.

Subsequently, as illustrated in FIG. 7(c), the object 1 is mounted and held on a mount table such that the front face 3 faces up, and the converging point of the laser light (hereinafter simply referred to as "converging point") is located on the rear face 21 side of the object 1. Then, while relatively moving the converging point in the X direction, the object 1 is irradiated (scanned) with the laser light L in an on/off mode from the front face 3 side. This forms a modified region 7 having a size corresponding to the shade of the discolored part H along the part 5 on the rear face 21 side of the discolored part H.

Here, the laser light L has an output of 0.6 W/pulse and a pulse width of 100 ns. The laser light L has a wavelength of 1064 nm, for example, and a pulse pitch of 0.25 μm (400 kHz_100 mm/s). Since a pulsed laser light is used as the laser light L for spot irradiation, the resulting modified region 7 is constituted by a modified spot. The modified region 7 incorporates therein fractures generated therefrom (as in modified regions which will follow).

Next, as illustrated in FIG. 8(a), the above-mentioned scan is repeatedly performed while progressively changing the Z-direction position of the converging point from the rear face 21 side to the front face 3 side in the object 1. This forms modified regions 7 joining each other along the part corresponding to the through hole 24 in the object 1. That is, the modified region 7 of the object 1 is formed in the discolored part H within the object 1.

Subsequently, as illustrated in FIG. 8(b), the object 1 is etched. Specifically, the object 1 is infiltrated with an etchant from the front face 3 side and rear face 21 side to the modified region 7, such as to advance the etching selectively along the modified region 7 and fractures incorporated therein. This selectively removes the inside of the object 1 along the modified region 7, thereby forming the through hole 24 in the object 1.

Next, as illustrated in FIG. 8(c), the object 1 is heat-treated at about 400° C., so as to cause the discolored part H to regain its color. That is, the transparency of the object 1 is restored (resumed), so that the color of the object 1 is returned to the original transparent color before discoloring. Thereafter, the object 1 is oxidized by wet oxidation or the like, so as to produce an electrically insulating film on the inner face of the through hole 24, and a conductor is inserted into the through hole 24. Then, electrode pads are formed on the front face 3 and rear face 21 so as to connect electrically with the conductor, whereby a through-hole electrode is constructed.

As in the foregoing, this embodiment discolors the object 1 by browning, so as to lower the transmittance for the laser light L in the discolored part H, whereby absorption of the laser light L is induced in the discolored part H, so that the modified region 7 is easily formed by convergence of the laser light L. Therefore, this embodiment can enhance the proccessability as easiness to process for the laser light L in the object 1 made of glass, thereby reducing the necessity for the laser light to attain a very short pulse or short wavelength.

As a result, it becomes unnecessary to modify irradiation conditions such as wavelength in the laser light L each time the material for the object 1 is changed. Hence, not only the object 1 made of glass, but also the object 1 made of other materials such as silicon can be laser-processed by using the same laser light source, whereby the productivity can be improved.

As mentioned above, this embodiment causes the discolored part H to regain its color by heat treatment and thus can inhibit the discoloring by browning from adversely affecting products.

As mentioned above, this embodiment discolors the object 1 such as to provide it with a shade corresponding to the size of the modified region 7 to be formed. That is, the intensity and time of irradiation with the X-ray 2 is controlled so as to adjust the shade of the discolored part H, whereby the absorptance of the laser light L in the object 1 is regulated. Hence, under the same irradiation condition of the laser light L, the processing size (the size of the modified region 7) can favorably be controlled by utilizing the difference in absorptance of the laser light L. As a result, darkening the discolored part H can form a larger modified region 7 by convergence of the laser light L, while brightening the discolored part H can form a smaller modified region 7 by convergence of the laser light L.

This embodiment also yields the following operations and effects. For example, when forming the through hole 24, the modified region 7 and fractures incorporated therein can be removed from the processed object 1 by etching, whereby its strength and quality can be improved. Since no cutting dust occurs during processing, an environment-friendly processing method can be achieved. For example, interposers and the like made by this embodiment can attain very thin wiring pitches, easy designing of wirings, and lower electric resistance in wirings.

This embodiment irradiates the object 1 with the X-ray 2 as mentioned above and thus may be hard to apply to a laser processing method for cutting the object 1 into semiconductor chips and the like. In this regard, this embodiment is used for forming the through hole 24 in the object 1 and can be considered less likely to have such a problem.

Second Embodiment

Figure 9:
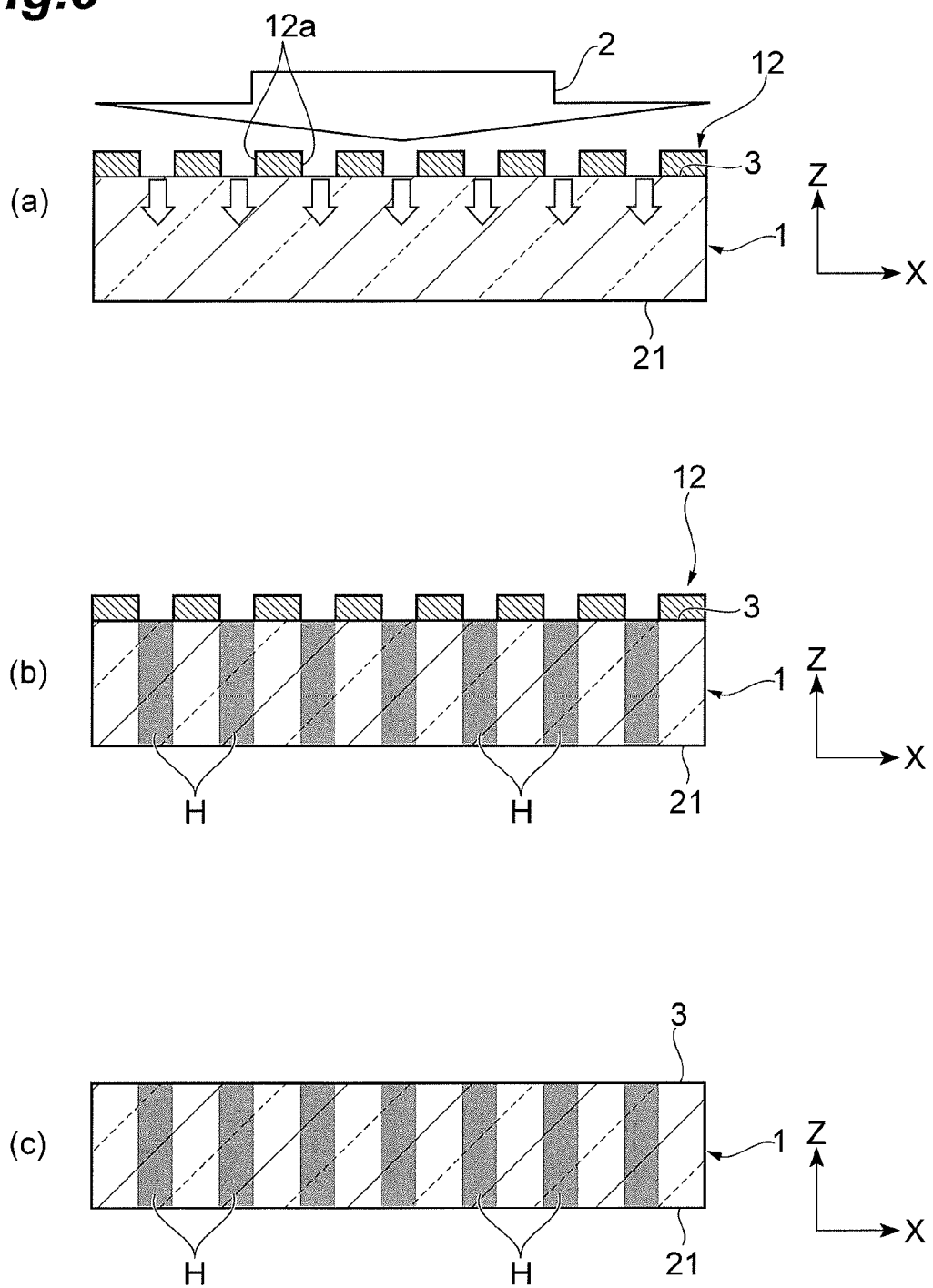
[FIG. 9](a) is a flow diagram illustrating the laser processing method in accordance with a second embodiment of the present invention, (b) is a flow diagram illustrating a sequel to FIG. 9(a), and (c) is a flow diagram illustrating a sequel to FIG. 9(b)
Figure 10:
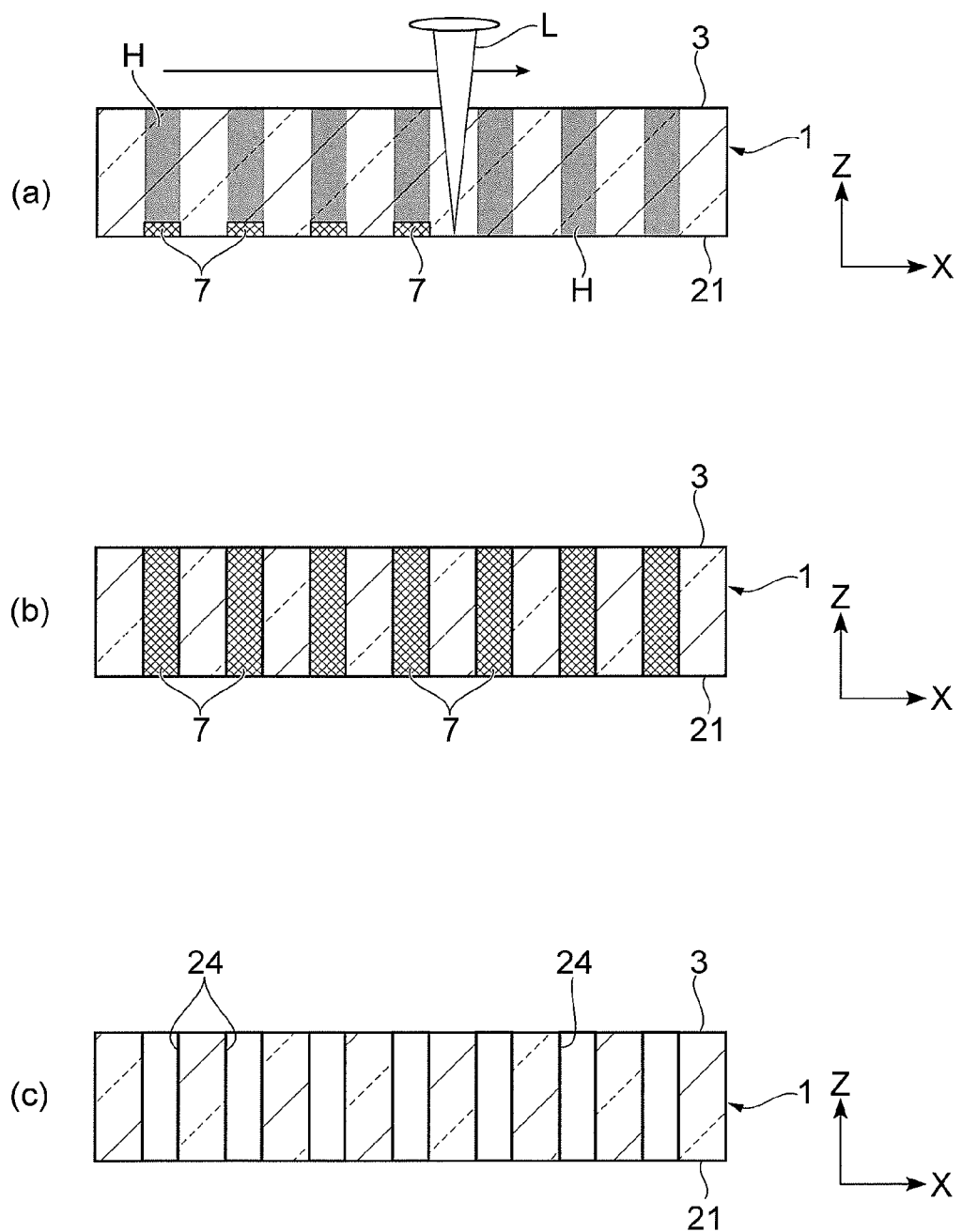
[FIG. 10](a) is a flow diagram illustrating a sequel to FIG. 9(c), (b) is a flow diagram illustrating a sequel to FIGS. 10(a), and (c) is a flow diagram illustrating a sequel to FIG. 10(b)

The second embodiment of the present invention will now be explained. FIGS. 9 and 10 are flow diagrams illustrating the laser processing method in accordance with the second embodiment of the present invention. This embodiment will be explained mainly in terms of differences from the above-mentioned first embodiment.

First, as illustrated in FIG. 9(a), the laser processing method in accordance with this embodiment forms a mask 12 having a predetermined pattern on the front face 3 of the object 1. Here, the mask 12 is constituted by a material (e.g., lead) which does not transmit the X-ray 2 therethrough and has a plurality of openings 12a arranged in a row along the X direction.

Subsequently, as illustrated in FIG. 9(b), the object 1 is surface-irradiated with the X-ray 2 for a predetermined time from the front face 3 side. This discolors the object 1 selectively according to the predetermined pattern of the mask 12. Specifically, the X-ray 2 enters only the regions corresponding to the openings 12a of the mask 12 in the object 1, whereby a plurality of discolored parts H are arranged in a row along the X direction.

Next, the mask 12 is removed as illustrated in FIG. 9(c), and then, as illustrated in FIG. 10(a), the object 1 is continuously irradiated with the laser light L under a fixed laser condition while locating the converging point on the rear face 21 side and relatively moving (scanning) the laser light L in the X direction. That is, the laser light L is relatively moved in the X direction so as to traverse the plurality of discolored parts H while irradiating them. As a consequence, modified regions 7 are formed in the respective discolored parts H because of their low transparency, while no modified regions are formed in the undiscolored parts because of their high transparency even when the laser light L is converged.

Subsequently, the above-mentioned scan is repeatedly performed while progressively changing the Z-direction position of the converging point from the rear face 21 side to the front face 3 side in the object 1. This forms modified regions 7 joining each other in the discolored parts H within the object 1 as illustrated in FIG. 10(b). Then, as illustrated in FIG. 10(c), the object 1 is etched, so as to remove the inside of the object 1 selectively along the modified regions 7. This removes a plurality of discolored parts H, thereby forming a plurality of through holes 24 extending in the Z direction.

As in the foregoing, this embodiment also achieves the above-mentioned operation and effect of enhancing the processability for the laser light L in the object 1 made of glass.

As mentioned above, this embodiment regulates regions with or without browning in the object 1 by using the mask 12, so as to discolor a plurality of parts of the object 1. In other words, it partly browns the object 1 through the mask 12, so as to produce regions transparent and nontransparent to the laser light L in the same object 1. Then, under a fixed irradiation condition, the laser light L irradiates the object 1 while relatively moving so as to transverse a plurality of discolored parts H, thereby selectively modifying the discolored parts H. Therefore, a plurality of modified regions 7 can be formed accurately in the object 1 without being irradiated with the laser light L in an on/off mode. Hence, irradiation condition control of the laser light L which is highly accurate and critical becomes unnecessary for forming a plurality of modified regions 7 in the object 1.

Third Embodiment

Figure 11:
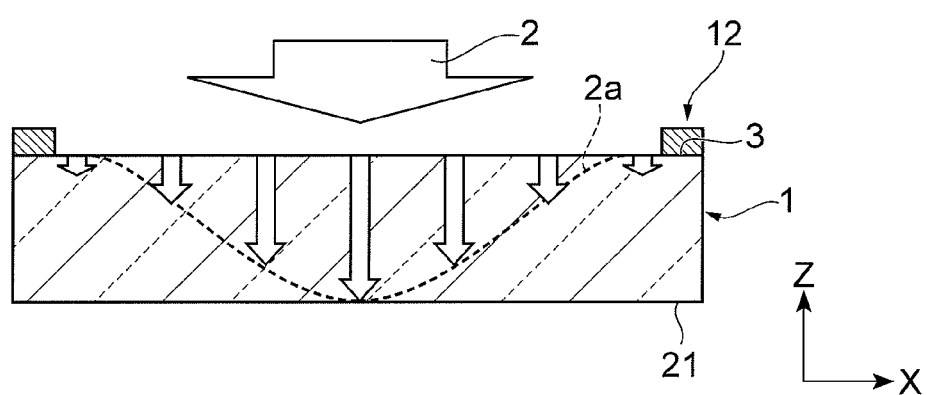
[FIG. 11](a) is a flow diagram illustrating the laser processing method in accordance with a third embodiment of the present invention, while (b) is a flow diagram illustrating a sequel to FIG. 11(a)
Figure 11:
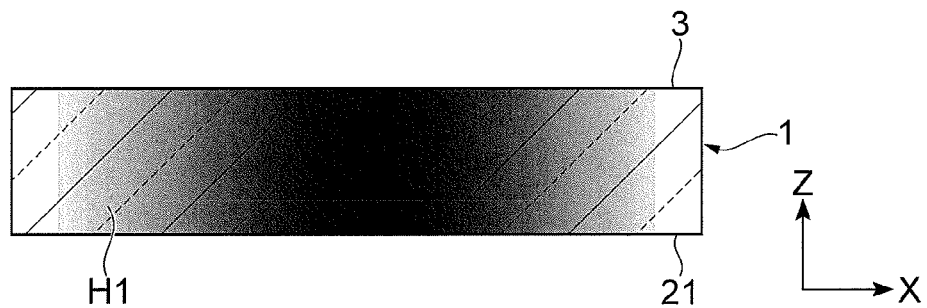
Figure 12:
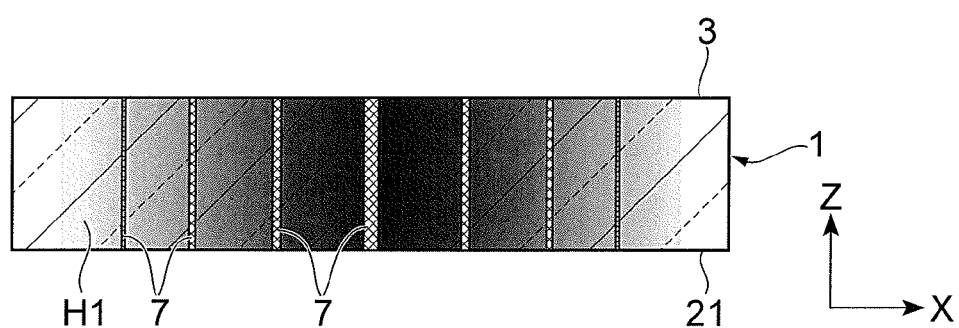
[FIG. 12](a) is a flow diagram illustrating a sequel to FIG. 11(c), while (b) is a flow diagram illustrating a sequel to FIG. 12(a)
Figure 12:
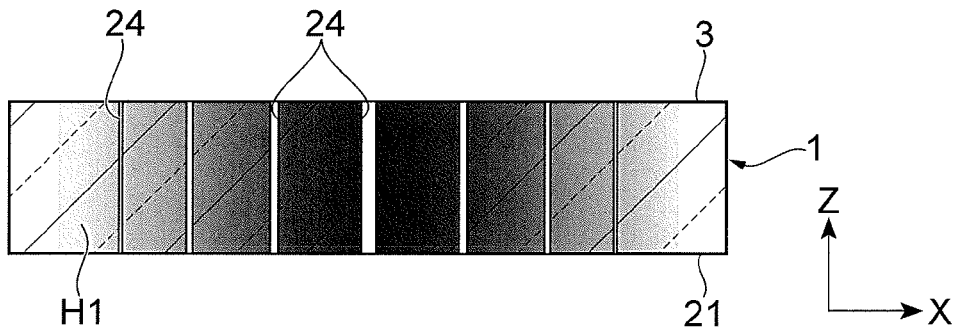

The third embodiment of the present invention will now be explained. FIGS. 11 and 12 are flow diagrams illustrating the laser processing method in accordance with the third embodiment of the present invention. This embodiment will be explained mainly in terms of differences from the above-mentioned first embodiment.

First, as illustrated in FIG. 11(a), the laser processing method of this embodiment forms a mask 12 having a predetermined pattern on the front face 3 of the object 1. Here, the mask 12 masks both end parts of the object 1 and is formed with an opening 12a which widely opens from its one end side to the other end side.

Subsequently, the object 1 is spot-irradiated (irradiated while being provided with an intensity distribution by utilizing diffraction) with the X-ray 2. Here, the X-ray 2 has an intensity distribution 2a shaped like a quadratic curve which is higher on the center side and quadratically decreases therefrom to the outer sides. This forms the object 1 with a discolored part H1 which is discolored such as to have a gradation as a stepwise shade which is darker on the center side and gradually becomes brighter on the outer sides as illustrated in FIG. 11(b).

Next, as illustrated in FIG. 12(a), the object 1 is repeatedly scanned with the laser light L in an on/off mode under a fixed irradiation condition while relatively moving the converging point in the X direction and progressively changing the Z-direction position of the converging point from the rear face 21 side to the front face 3 side in the object 1. As a consequence, modified regions 7 having sizes corresponding to shades of the discolored part H1 are formed such as to join with each other along the parts corresponding to through holes 24 in the discolored part H1.

Here, since the discolored part H has a gradation according to which the transmittance of the laser light varies as mentioned above, a plurality of modified regions 7 having sizes varying according to the gradation can be formed collectively by the above-mentioned scan. Specifically, the sizes of the plurality of modified regions 7 formed collectively become greater on the center side of the object 1 and smaller on the outer sides.

Subsequently, as illustrated in FIG. 12(b), the object 1 is etched, so as to remove the inside of the object 1 selectively along the modified regions 7. This collectively forms a plurality of through holes 24 having diameters different from each other in conformity to the sizes of the modified regions 7. Here, the diameters of the through holes 24 correspond to the sizes of the modified regions 7, i.e., the gradation of the discolored part H1, so that the diameter of the through holes 24 is greater on the center side of the object 1 and becomes smaller on the outer sides.

As in the foregoing, this embodiment also achieves the above-mentioned operation and effect of enhancing the proccessability for the laser light L in the object 1 made of glass.

As mentioned above, since the discolored part H1 has a gradation, this embodiment can collectively form a plurality of modified regions 7 having different sizes according to the gradation under a fixed irradiation condition of the laser light L. That is, appropriately irradiating the object 1 in an on/off mode under a fixed laser condition while relatively moving the converging point can form greater and smaller modified regions 7 in darker and brighter regions in the discolored part H1.

While the discolored part H1 has a gradation which is darker on the center side and becomes brighter on the outer sides, the gradation of the discolored part is not limited thereto.

Figure 13:
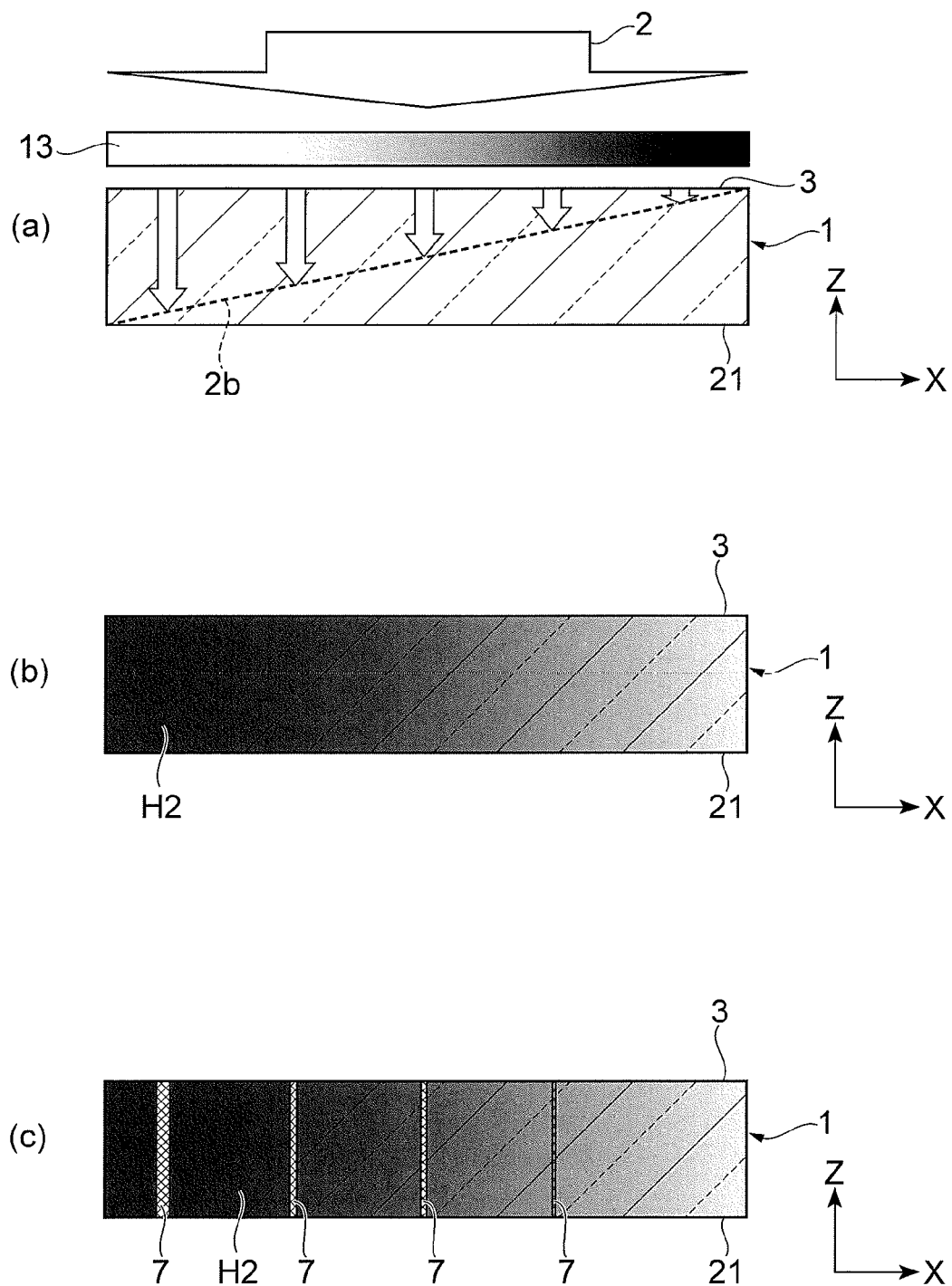
[FIG. 13](a) is a flow diagram illustrating the laser processing method in accordance with a modified example, (b) is a flow diagram illustrating a sequel to FIGS. 13(a), and (c) is a flow diagram illustrating a sequel to FIG. 13(b)

For example, as illustrated in FIG. 13, it may have a gradation which becomes brighter (or darker) from one end side to the other end side in the X direction of the object 1. First, in this case, an X-ray absorption filter 13 is disposed on the front face 3 of the object 1 as illustrated in FIG. 13(a). The X-ray absorption filter 13 has a pattern corresponding to the gradation of the discolored part H, which gradually becomes greater (or smaller) from one end side to the other end side in the X direction of the object 1 here.

Subsequently, the object 1 is surface-irradiated with the X-ray 2 through the X-ray absorption filter 13. As a consequence, the X-ray 2 incident on the object 1 attains an intensity distribution 2b in which the intensity gradually becomes smaller (greater) from one end side to the other end side in the X direction of the object 1. This forms a discolored part H2 in the object 1 as illustrated in FIG. 13(b).

Thereafter, as illustrated in FIG. 13(c), the object 1 is irradiated with the laser light L appropriately in an on/off mode under a fixed condition while relatively moving the converging point, whereby a plurality of modified regions 7 are formed in the discolored part H2 such as to reduce their sizes from one end side to the other end side in the X direction.

Figure 14:
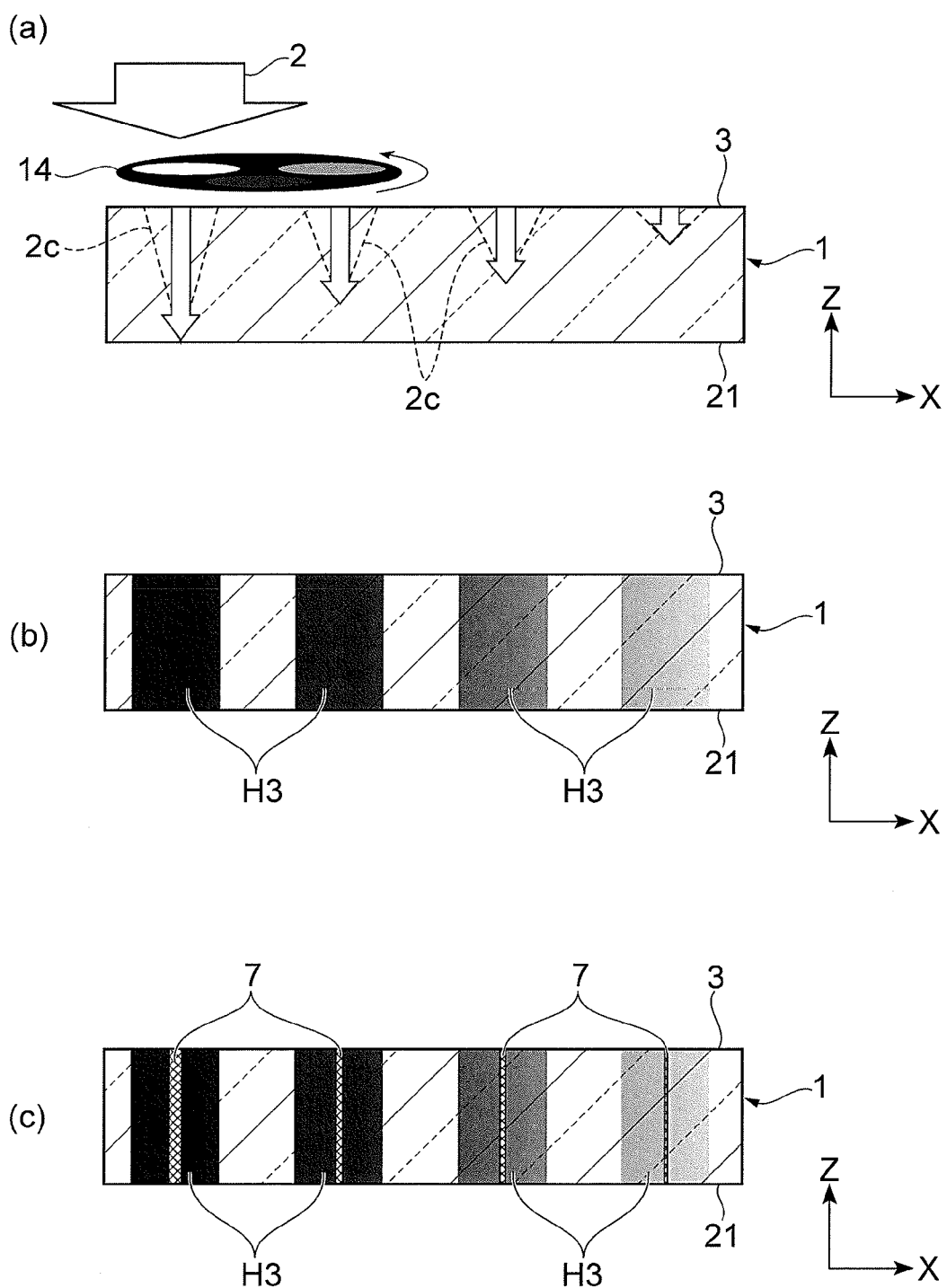
[FIG. 14](a) is a flow diagram illustrating the laser processing method in accordance with another modified example, (b) is a flow diagram illustrating a sequel to FIGS. 14(a), and (c) is a flow diagram illustrating a sequel to FIG. 14(b).

As illustrated in FIG. 14, for example, a plurality of discolored parts H3 may be formed at given positions in the object 1, while having a gradation among them. In this case, as illustrated in FIG. 14(a), an X-ray absorption mechanism 14 equipped with a plurality of switchable X-ray absorption filters having different transmittances is used such that a plurality of given positions are irradiated with the X-ray 2 so as to yield intensity distributions different from each other.

Here, when irradiating the object 1 with the X-ray 2 at a position on one end side in the X direction of the object 1, the X-ray absorption filters of the X-ray absorption mechanism 14 are switched such that the intensity distribution 2c of the incident X-ray becomes greater than that upon irradiation with the X-ray 2 at a position on the other end side. As a result, a plurality of discolored parts H3 which become brighter from one end side to the other end side in the X direction of the object 1 are formed in the object 1 as illustrated in FIG. 14(b).

Thereafter, as illustrated in FIG. 14(c), scanning with the laser light appropriately in an on/off mode under a fixed laser condition while relatively moving the converging point forms a plurality of modified regions 7 in the respective discolored parts H3 such that their sizes become smaller from one end side to the other end side in the X direction.

Though preferred embodiments of the present invention have been explained in the foregoing, the present invention is not limited thereto but may be modified or applied to others within the scope not changing the gist recited in each claim.

For example, the laser light entrance surface for forming the modified regions is not limited to the front face 3 of the object 1, but may be the rear face 21 of the object 1. Though the above-mentioned embodiments emit the X-ray 2 for browning, radiations other than the X-ray 2 may be emitted as long as the object can be discolored by browning. Though all the discolored parts H regain the color in the above-mentioned embodiments, at least a part of the modified regions may regain the color.

The above-mentioned embodiments form a plurality of modified regions 7 by repeatedly performing a scan which moves the converging point along the front face 3 of the object 1 while changing the converging point position in the Z direction, in which the direction and order of scanning is not limited. For example, irradiation with the laser light L while moving the converging point along a through hole 24 to form a modified region 7 may be repeated by the number of through holes 24.

The on/off irradiation with the laser light L in the above-mentioned embodiments may be performed not only by controlling the on/off of the emission of the laser light L, but also by opening/closing a shutter disposed on the optical path of the laser light L or by masking on/off the front face 3 of the object 1, for example. Further, the intensity of the laser light L may be controlled between an intensity at a threshold for forming the modified region 7 (processing threshold) or higher and an intensity lower than the processing threshold.

INDUSTRIAL APPLICABILITY

The laser processing method in accordance with the present invention can enhance the proccessability for the laser light in the object made of glass.

REFERENCE SIGNS LIST

1 . . . object to be processed; 7 . . . modified region; 24 . . . through hole; H, H1, H2, H3 . . . discolored part; L . . . laser light

The invention claimed is:

1. A laser processing method of converging a laser light into an object to be processed made of glass so as to form a modified region and etching the object along the modified region so as to form a through hole in the object, the method comprising:
 a browning step of discoloring at least a part of the object by browning;
 a laser light converging step of forming the modified region in a discolored part of the object by converging the laser light into the object after the browning step; and
 an etching step of etching the object after the laser light converging step so as to advance the etching selectively along the modified region and form the through hole.

2. A laser processing method according to claim 1, further comprising a color recovery step of recovering a color in at least a part of the discolored part in the object by heat-treating the object after the laser light converging step.

3. A laser processing method according to claim 1, wherein the browning step discolors a plurality of parts in the object; and wherein the laser light converging step irradiates the object with the laser light while relatively moving the laser light in one direction so as to traverse the plurality of discolored parts.

4. A laser processing method according to claim 1, wherein the discolored part has a shade corresponding to a size of the modified region to be formed in the laser light converging step.

5. A laser processing method according to claim 4, wherein the discolored part has a gradation.

* * * * *